(12) United States Patent
Oyamada

(10) Patent No.: US 6,337,438 B1
(45) Date of Patent: *Jan. 8, 2002

(54) CASING STRUCTURE OF COMMUNICATION EQUIPMENT

(75) Inventor: Takashi Oyamada, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 222 days.

(21) Appl. No.: 08/966,788

(22) Filed: Nov. 10, 1997

(30) Foreign Application Priority Data

Nov. 8, 1996 (JP) .............................................. 8-312750

(51) Int. Cl.[7] .............................. H02G 3/08; H05K 5/00
(52) U.S. Cl. .................................. 174/52.1; 174/40 CC; 174/40 R; 174/41; 174/59
(58) Field of Search ........................... 174/40 CC, 52.1, 174/40 R, 41, 59

(56) References Cited

FOREIGN PATENT DOCUMENTS

| JP | 63-81622 | 5/1988 |
|----|----------|--------|
| JP | 1-152798 | 6/1989 |
| JP | 1-34365 | 10/1989 |
| JP | 2-62103 | 5/1990 |
| JP | 7-131163 | 5/1995 |
| JP | 7-39133 | 7/1995 |
| JP | 7-307582 | 11/1995 |

Primary Examiner—William A. Cuchlinski, Jr.
Assistant Examiner—Ronnie Mancho
(74) Attorney, Agent, or Firm—Foley & Lardner

(57) ABSTRACT

A casing structure for a communication equipment in which panels mounted in the casing are electrically insulated from a messenger wire. When the casing of the communication equipment is mounted on the messenger wire, the insulation prohibits impediments otherwise caused by extraneous noise current flowing in the messenger wire. The mounting portion of the case has a handle structure which provides improved operability and convenience.

20 Claims, 4 Drawing Sheets

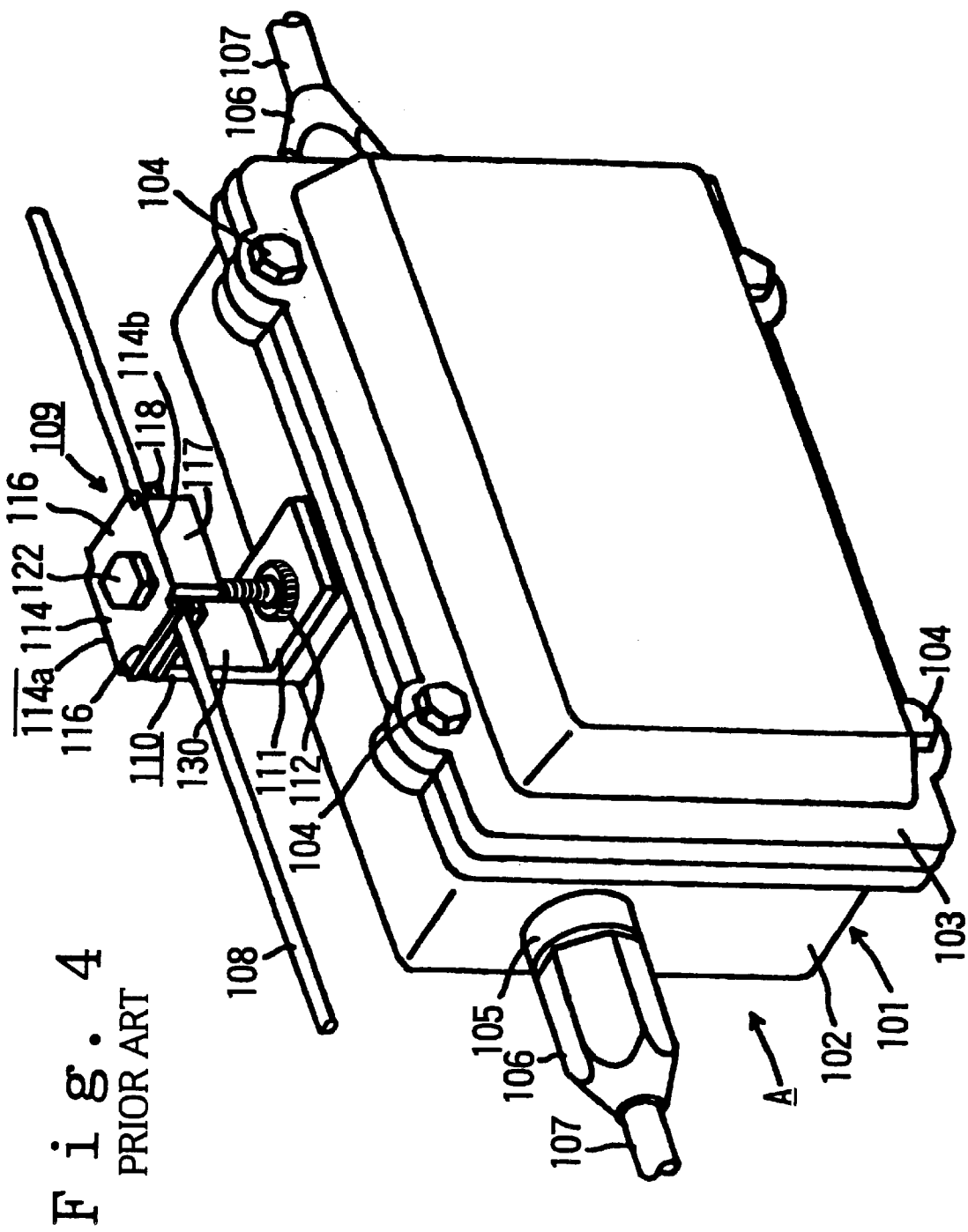

CASING STRUCTURE OF COMMUNICATION EQUIPMENT

FIELD OF THE INVENTION

This invention relates to a casing structure of a communication equipment used for a wireless communication base station for e.g., the personal handy phone system (PHS). More particularly, it relates to a casing structure having a suspension structure from a messenger wire installed between communication pillars as one of the mounting sites and which is improved in workability during transport and installation.

BACKGROUND OF THE INVENTION

As a prior art of this sort, the JP Utility Model Kokai JP-Utility Model Kokai-A-2-62103 proposes, a fastener device between an equipment casing and a messenger wire having a grooved hooked member having a unitary structure with the equipment casing, a U-shaped clamping member and a tightening member, such as a bolt, for thrusting the inner rim portion of a web of the clamping member against the end face of the hooked member for securing the clamping member. The clamping member has the inner peripheral side of a web of the U-shape thereof abutted against the end face of the U-shape and both arm portions of the U-shape are of a longer and a shorter size, with the messenger wire housed within the grooved portion of the hooked member being clamped by tapered portions formed on both of the arm portions of the U-shape.

Also, the JP Utility Model Kokoku JP-UM-B-1-34365 shows a mounting fixture in which an attachment 111 is secured to a main body portion of an electronic equipment A by a bolt 112 and a messenger wire 108 is clamped and suspended by a suspension piece 114 and a tightening screw rod 122.

SUMMARY OF THE DISCLOSURE

However, according to the investigation toward the present invention, it has turned out that the above-described prior-art technique has the following drawbacks.

The first problem is that electronic components mounted on a panel in a casing suffers maloperations by the extraneous noise transmitted over the messenger wire and is destroyed in the worst case.

The reason is that the equipment casing is formed by aluminum die-casting and the securing portion to the messenger wire is also formed unitarily with the casing, thus assuring an electrically conducting state.

The second problem is that the equipment of this sort is heavy in weight and difficult to transport in the stage of production in the factory or in the mounting stage on the mounting site such that there is risk of a failure to fall down.

Thus the casing is difficult to handle for operators of week bodily force, such as the aged or females.

The reason is that the casing is formed of aluminum die-cast in many cases and is heavy in weight, while being of a slippy surface because of the box-like overall shape.

In view of the above depicted status of the art, it is an object of the present invention to provide a casing structure for a communication equipment in which panels mounted in the inside of the communication equipment and the messenger wire in the mounted state of the casing to the messenger wire are electrically insulated from each other for prohibiting impediments otherwise caused by the extraneous noise current and in which the mounting portion is of a handle structure for facilitated transport for assuring facilitated handling and for improving operability and operating convenience.

Other objects of the present invention will become apparent in the entire disclosure.

According to an aspect of the present invention there is provided a novel structure of a casing for a communication equipment.

The casing is made up of a casing portion and a cover are provided with two hinges permitting the opening/closure of the casing. A bar-shaped handle of an electrically non-conductive material is provided between the hinges.

According to the present invention, it is preferred that an insulating bar-shaped handle is provided between a pair of hinges operating as a pivot permitting opening/closure of the casing portion and the cover of the casing of the communication equipment. A recess of substantially semi-circular cross section is formed in the upper part of the handle, extending along a longitudinal direction thereof so that the messenger wire will be placed in the recess. In this state, a U-shaped plate-shaped metal fixture is placed over the handle and the resulting assembly is secured in situ with a fastening member, for example, set-screws.

The outline of the present invention will be now explained. In general, the casing of the communication equipment is comprised of a casing portion and a cover, and within the casing a panel etc., such as a printed board carrying electrical and electronic components, is screwed in position.

According to the present invention, the casing portion and the cover are provided with hinges permitting opening/closure of the casing. These hinges are molded in a unitary body with the casing portion and the cover, respectively. If formed of aluminum, the hinges are electrically connected to the inner panel mounting portion. A bar-shaped handle of an electrically non-conductive material is provided between the two hinges operating as pivot and a recess of the substantially semi-circular cross section is formed in the upper part of the handle, extending along the length thereof so that the messenger wire is placed within the recess.

By this construction, the casing is transported with the handle and, when mounted, the casing is electrically insulated from the messenger wire of metal.

BRIEF DESCRIPTION OF THE DRAWINGS

FIG. 4 is a perspective view illustrating the fastening; device fastening the casing and the messenger wire of the prior-art example.

PREFERRED EMBODIMENT OF THE INVENTION

Figure 1:
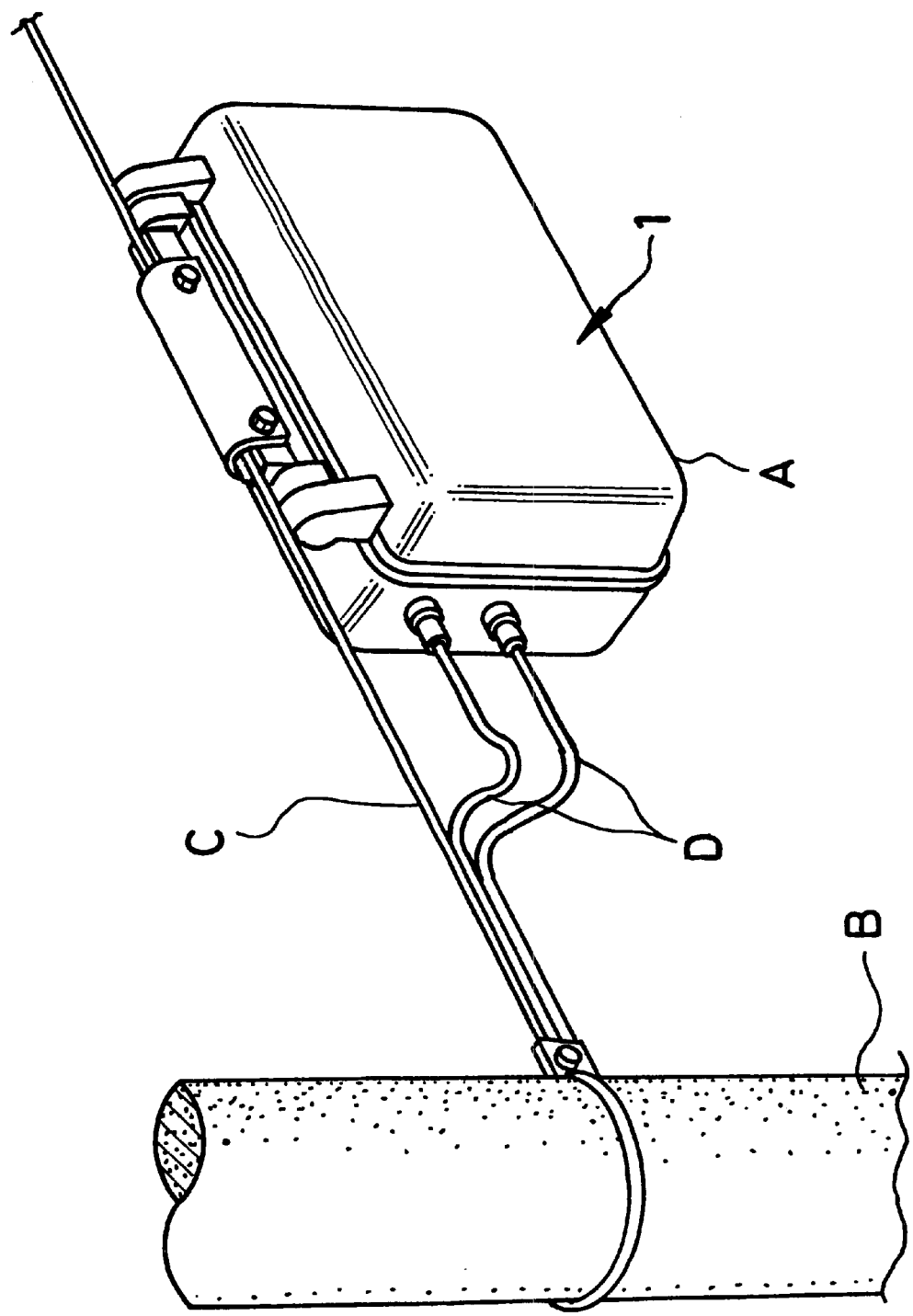
FIG. 1 is a perspective view illustrating an embodiment of the present invention.
Figure 2:
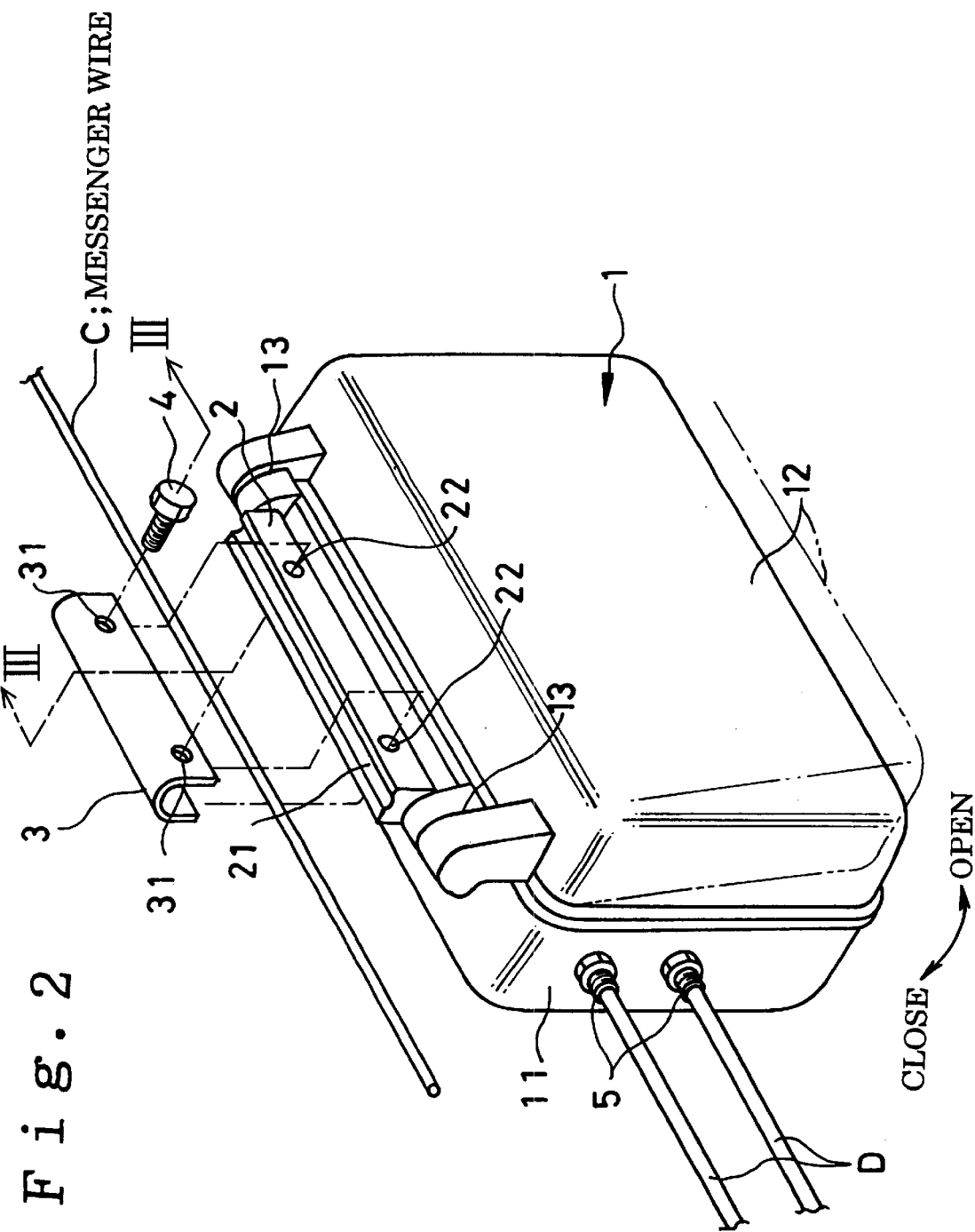
FIG. 2 is an exploded perspective view illustrating the embodiment of the present invention.
Figure 3:
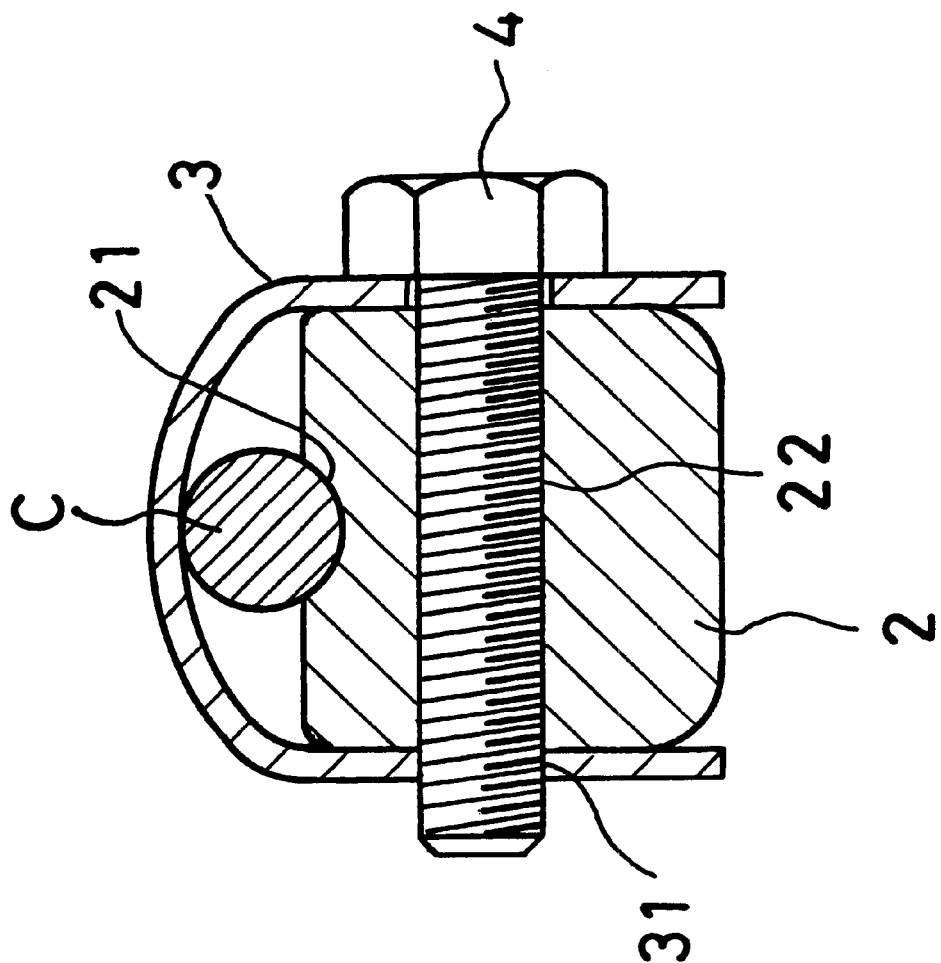
FIG. 3 is a cross-sectional view showing the mounting, portion in the embodiment of the present invention.

Referring to the drawings, a preferred embodiment of the present invention will be explained in detail. FIGS. 1 and 2 are perspective views for illustrating the preferred embodiment of the invention. Specifically, FIG. 1 shows the mounting state of a messenger wire and FIG. 2 is an exploded perspective view showing assembling steps. FIG. 3 is a cross-sectional view showing essential portions of a mounting portion for a messenger wire.

The casing of the communication equipment is made up of a casing portion 11 and a cover 12. Within the casing, there are secured panels etc., such as a printed board having loaded thereon electrical or electronic components, such as by screws.

A pair of hinges 13 are provided to permit opening and closure of the casing portion 11 and the cover 12 relative to each other. Hinge portions of each hinge 13 are formed solid with the casing portion 11 and the cover 12, respectively, by aluminum die-casting.

Between the two hinges 13, operating as pivot for opening/closure, there is mounted a bar-shaped handle 2 formed of an electrically non-conductive material. Referring to the transverse cross-sectional view of FIG. 3, the upper surface of the handle 2 is formed with a recess or groove 21 of substantially semi-circular cross section extending along the length of the handle. Upon mounting, the messenger wire C is received within the recess 21.

For mounting the casing with respect to the messenger wire C, a metal fixture 3 and a number of set-screws 4 are used.

The operator usually carries the casing 1 by holding it at the handle 2. During mounting the casing 1 on the messenger wire C, the casing 1 is electrically insulated from the messenger wire of metal for protection against the electrical noise from outside.

EXAMPLES

An example of the present invention is explained for more detailed illustration of the preferred embodiment of the invention. The mounting site of the communication equipment A used in a simplified portable telephone system is determined by optimum base stations designated for presenting telephone services to pedestrians on a road. As one of the mounting sites, the messenger wire C installed between telegraph poles B is preferentially used. The messenger wire C is formed by twisted stainless steel wires and installed along with other communication cables, such as those for CATV.

FIG. 2 is an exploded perspective view showing an embodiment of the present invention. The casing 1 of a communication equipment A is fabricated by aluminum die-casting and is roughly made up of the casing portion 11 and the cover 12. The casing 1 carries a connection plug 5 for connection to outside and has housed therein panels such as printed circuit boards carrying electrical or electronic components thereon. These panels are not shown in the perspective view of FIG. 2.

The casing portion 11 and the cover 12 are coupled to each other by the hinges 13, each hinge portion being formed integral with the upper wall section of the casing portion 11 or cover 12, respectively, so that the casing 1 is constructed to permit the casing portion 11 and the cover 12 to be opened or closed like a shell.

Between the two hinges 13, a bar of plastics, as an electrically insulating member, termed handle 2, is provided and connected to the hinges.

The upper surface of the handle 2 is formed with a substantially semi-circularly cross sectioned recess 21 in which the messenger wire C is set. On the lateral sides of the handle 2 are formed tapped holes 22 for securing the metal fixture 3.

The metal fixture 3 is a metal plate warped in the form of a letter U and provided with mounting holes 31.

FIG. 3 shows essential portions of a mounting portion 9 in cross-section. For mounting to the messenger wire C, the metal fixture 3 and the set screws 4 are used. That is, the set screws 4 are inserted into the mounting holes 31 of the metal fixture 3 and into the tapped holes 22 of the handle and fastened and the casing 1 is suspended as shown in FIG. 1.

That is, the construction of the communication equipment A can be easily achieved by inserting the set screws 4 from the lateral side with the messenger wire C clamped between the handle 2 and the metal fixture 3 from above.

That is, until mounting the communication equipment A on the mounting site, there are involved a large number of transporting steps carried out by operators, such as assembling, operations on inspection lines in the factory, packaging operation or operations on the mounting site. In such case, the operations are facilitated if the handle 2 mounted on the casing 1 is used.

If the hinges 13 protruded from the lateral side as in the conventional casing are designed aesthetically, the handle 2 can be mounted at a mounting portion not awkward in appearance thus presenting no problem after mounting.

The effect of protection from the extraneous noise via the messenger wire C in the present invention will be now explained.

As may be seen from the explanation in connection with FIG. 3, the messenger wire C of metal is contacted with the handle 2 of the electrically non-conductive material to preclude adverse effects on the casing 1. The result is that the noise current to the inner panel, presenting a problem in the prior art, can be interrupted completely.

As explained above, the following results are displayed in the present invention.

The first effect of the present invention is that malfunction or destruction due to the extraneous noise transmitted through the messenger wire of the electronic components mounted on the panel in the casing can be reliably prevented.

The reason is that, while the casing of the equipment is formed by aluminum die-casting, the mounting portion to the messenger wire is formed by a bar-shaped handle of the insulating material, thus assuring an electrically insulated state.

The second effect of the present invention is that the casing can be easily transported in the manufacturing stage in the factory or in the mounting stage on the mounting site, thus facilitating handling.

The reason is that the bar-shaped handle according to the present invention lends itself to facilitated transport even by the aged or females of weak physical force.

As many apparently widely different embodiments of the present invention can be made without departing from the spirit and scope thereof, it is to be understood that the invention is not limited to the specific embodiments thereof except as defined in the appended claims.

What is claimed is:

1. A communication equipment comprising:
 a casing including a base, a cover attached to the base by two hinges that permit the opening and closing of the casing, and at least one electrical component housed within said casing; and
 a handle of an electrically non-conductive material on said casing,
 said handle providing electrical insulation of said casing from a messenger wire.

2. The communication equipment according to claim 1, wherein at least one of the base and the cover is made of conductive material.

3. The communication equipment according to claim 2, further comprising a mounting member secured to the handle.

4. The communication equipment according to claim 3, wherein said messenger wire is received between the mounting member and the handle, and the mounting member rests on the messenger wire to suspend the casing from the messenger wire.

5. The communication equipment according to claim 4, wherein the mounting member is U-shaped.

6. The communication equipment according to claim 4, wherein the handle has a recess of a substantially semi-circular cross section running lengthwise along an upper surface thereof and the messenger wire is received in the recess.

7. The communication equipment according to claim 6, wherein the mounting member clamps the messenger wire in the recess.

8. The communication equipment according to claim 1, wherein at least part of said hinges supports the handle.

9. A communication equipment suspended from a messenger wire, comprising:
   a base;
   a cover attached to the base by two hinges; and
   a handle of an electrically non-conductive material arranged between and supported by at least part of said hinges.

10. The communication equipment according to claim 9, wherein at least one of the base and the cover is made of conductive material.

11. The communication equipment according to claim 10, further comprising a mounting member, wherein the mounting member is secured to the handle and the messenger wire is received between the mounting member and the handle.

12. The communication equipment according to claim 11, wherein the handle has a recess of a substantially semi-circular cross section running lengthwise along an upper surface thereof and the messenger wire is received in the recess.

13. The communication equipment according to claim 12, wherein the mounting member comprises a metal plate warped in the form of a letter U and the messenger wire is received in the concave side of the metal plate.

14. The communication equipment according to claim 9, wherein the hinges comprise hinge portions which are integrally formed on the base and the cover.

15. A method of mounting a communication equipment on a messenger wire, said method comprising the steps of:
   positioning the wire above a non-conductive handle of the communication equipment; and
   clamping the messenger wire to the handle using a warped metal plate.

16. The method according to claim 15, wherein the step of clamping includes the steps of positioning a concave side of the warped metal plate above the messenger wire, and securing sides of the warped metal plate to sides of the non-conductive handle.

17. The method according to claim 16, wherein the step of securing includes the step of inserting set screws in complementary holes formed in the warped metal plate and the non-conductive handle.

18. The method according to claim 15, wherein the step of positioning the wire includes the step of positioning the wire in a recess of recess of a substantially semi-circular cross section running lengthwise along an upper surface of the non-conductive handle.

19. The method according to claim 18, wherein the step of clamping includes the steps of positioning a concave side of the warped metal plate above the messenger wire, and securing sides of the warped metal plate to sides of the non-conductive handle.

20. The method according to claim 19, wherein the step of securing includes the step of inserting set screws in complementary holes formed in the warped metal plate and the non-conductive handle.

\* \* \* \* \*